United States Patent [19]

Higuchi et al.

[11] 4,291,326
[45] Sep. 22, 1981

[54] SEMICONDUCTOR DEVICE

[75] Inventors: Mitsuo Higuchi, Tokyo; Kiyoshi Miyasaka, Yokohama, both of Japan

[73] Assignee: Fujitsu Limited, Japan

[21] Appl. No.: 96,217

[22] Filed: Nov. 20, 1979

[30] Foreign Application Priority Data

Nov. 27, 1978 [JP] Japan .................................. 53-146248

[51] Int. Cl.³ ........................................ H01L 27/02
[52] U.S. Cl. ..................................... 357/51; 357/41; 357/30; 307/DIG. 4
[58] Field of Search ......................... 357/51, 41, 30; 307/DIG. 4

[56] References Cited

U.S. PATENT DOCUMENTS

| | | | |
|---|---|---|---|
| 3,903,431 | 9/1975 | Heeren | 307/205 |
| 4,028,558 | 6/1977 | Heller | 307/355 |
| 4,031,415 | 6/1977 | Redwine | 307/279 |
| 4,216,489 | 8/1980 | Clemens | 357/41 |

Primary Examiner—Martin H. Edlow
Attorney, Agent, or Firm—Staas and Halsey

[57] ABSTRACT

A semiconductor device for use in a bootstrap circuit comprising: first and second MIS field effect transistors connected in series between a power supply line and ground; third and fourth MIS field effect transistors connected in series between the power supply line and ground; a capacitor connected between the gate and source of the third MIS field effect transistor, and; a fifth MIS field effect transistor connected between first and second nodes, the first node connecting the first and second MIS field effect transistors, and the gate of the third MIS transistor, the second node connecting the third and fourth MIS field effect transistors being connected to an output of the device, wherein a p-n junction portion which is connected to the capacitor is protected by a cover for preventing light from penetrating thereinto.

15 Claims, 13 Drawing Figures

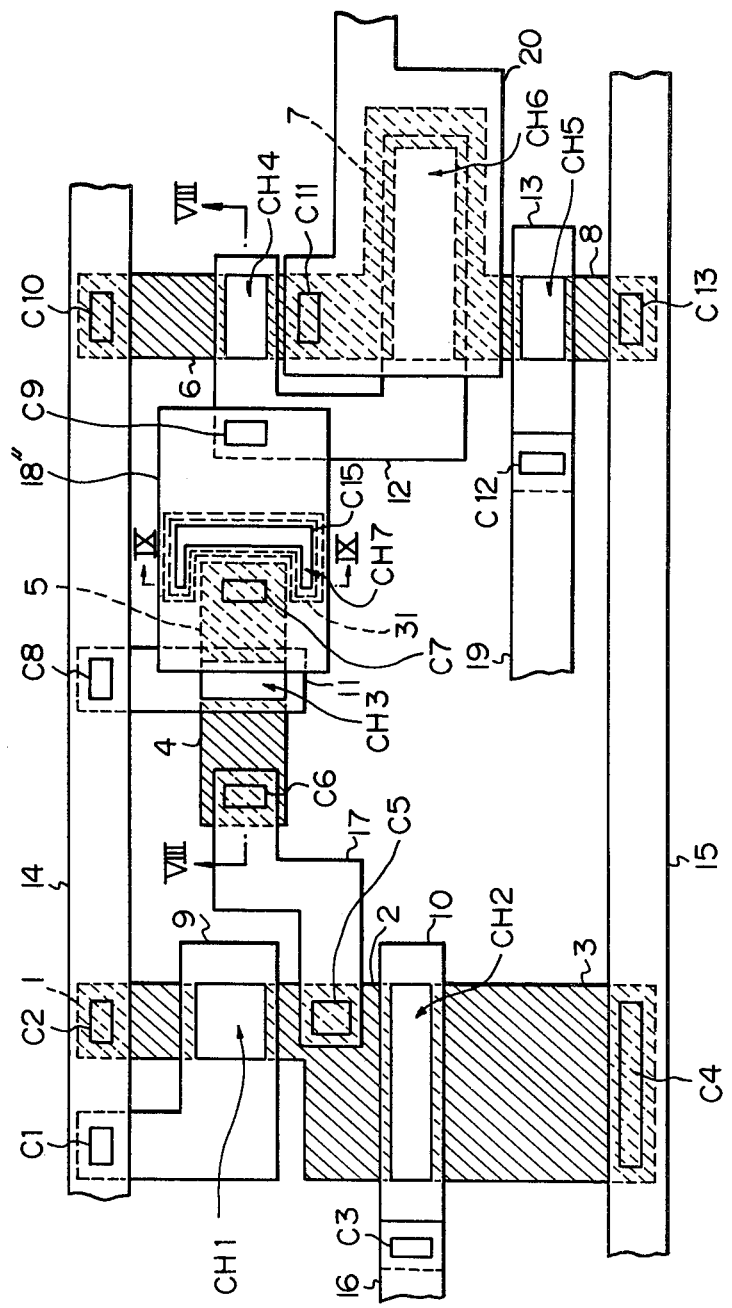

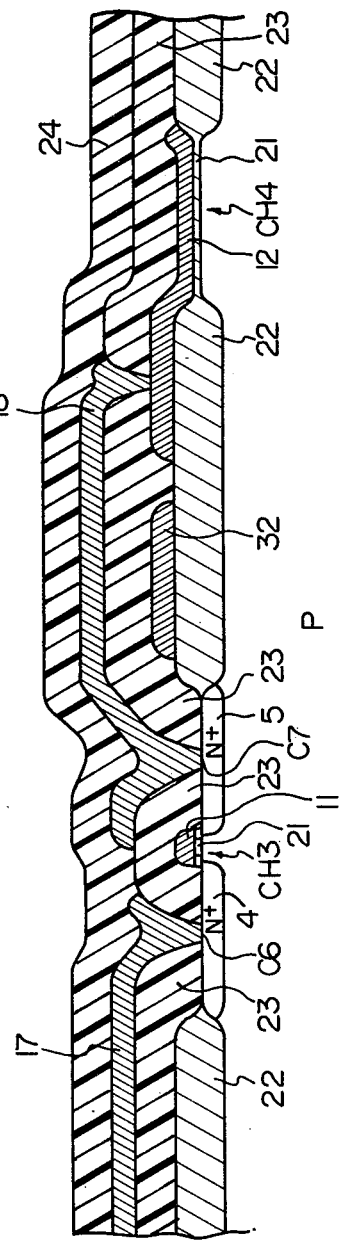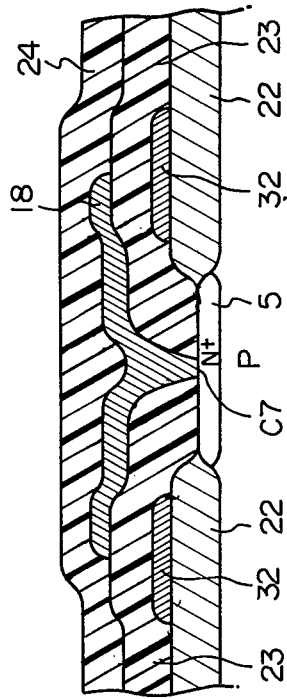
Fig. 11
Fig. 12

1

SEMICONDUCTOR DEVICE

BACKGROUND OF THE INVENTION

1. Field of the Invention

This invention relates generally to a semiconductor device and, more particularly, to a semiconductor device for use in bootstrap circuits included in an Erasable and Programmable Read-Only Memory (hereinafter referred to as EPROM) device which can be erased by ultraviolet light and reprogrammed bit by bit with appropriate voltage pulses.

In general, an EPROM is provided with a means for producing a high-voltage and high-power signal when the EPROM is reprogrammed. One of such means is a bootstrap circuit. A package for accommodating a chip on which an EPROM is formed has a window for receiving ultraviolet light. When it is necessary to erase the content of the EPROM, the entire chip is exposed to strong ultraviolet light from an ultraviolet light generating unit. The ultraviolet light comes through the window of the package accommodating the chip. However, when the entire package is put into a box, the package is not exposed to any kind of light. In addition, the EPROM can be used in a light room, since the intensity of the ultraviolet component of the light in the light room is so small that the EPROM would not be erased.

2. The Prior Art

A prior art semiconductor device for use in bootstrap circuits included in an EPROM which can be erased by ultraviolet light comprises a capacitor, wherein the difference in potential between the two conducting surfaces of the capacitor causes a high-voltage and high-power signal. In order to reprogram the EPROM effectively, the difference potential should be maintained at a high level as long as possible.

However, in the prior art device, when the EPROM is reprogrammed in a light room, a connection node of the capacitor and a MIS (Metal-Insulator-Semiconductor) field effect transistor are exposed to light. The light penetrates into a p-n junction portion formed by a substrate of one conductivity type and the source or drain region of another conductivity type of the MIS field effect transistor. As a result, the charge of the source or drain region is decreased and, accordingly, the charge of the capacitor is also decreased. This is because one of the conducting surfaces of the capacitor is connected to the source or grain region through one or more electrically conductive materials. Therefore, the difference in potential of the capacitor becomes small, and this may cause the writing of new data into the EPROM in a light room to fail.

SUMMARY OF THE INVENTION

It is a principal object of the present invention to provide a semiconductor device for use in bootstrap circuits included in an EPROM which can be erased by ultraviolet light, and which are such that after erasing, the EPROM can be reprogrammed effectively even in a light room.

According to the present invention, there is provided a semiconductor device for use in a bootstrap circuit comprising: first and second MIS field effect transistors connected in series between a power supply line and ground, the second MIS field effect transistor receiving a first input signal; third and fourth MIS field effect transistors connected in series between the power supply line and ground, the fourth MIS field effect transistor receiving a second input signal; a capacitor connected between the gate and source of the third MIS field effect transistor, and; a fifth MIS field effect transistor connected between first and second nodes, the first node connecting the first and second MIS field effect transistors, and the gate of the third MIS transistor, the second node connecting the third and fourth MIS field effect transistors being connected to an output of the device, wherein a p-n junction portion which is connected to the capacitor is protected by a cover for preventing light from penetrating thereinto.

According to the present invention, a semiconductor device is also provided for use in bootstrap circuits comprising: a semiconductor substrate of a first conductivity type, such as a p-type; three regions of a second conductivity type, such as an $n^+$-type, formed in the substrate; a first insulating layer formed on the substrate and arranged between the first and second regions, such as silicon dioxide; a second insulating layer formed on the substrate and arranged adjacent to the third region; a third insulating layer formed on the substrate and arranged between the second region and the second insulating layer; a first electrically conductive layer of a first material, such as polycrystalline silicon formed on the first insulating layer; a second electrically conductive layer of the first material formed on the second insulating layer and extending to the third insulating layer; a third electrically conductive layer of a second material, such as aluminium, for connecting the second region and the second electrically conductive layer, the third electrically conductive layer overlying the whole of the second region, and; an insulating layer arranged between the first and second materials. The first electrically conductive layer, the first insulating layer and the first and second regions form a MIS transistor, while a surface of the second electrically conductive layer and a surface of the substrate adjacent to the third region, which surfaces are separated by the second insulating layer, form a capacitor. Even if the semiconductor device is placed in a light room, the charge of the second region may not be decreased, since the third electrically conductive layer, which serves as a cover, prevents the light from penetrating into the p-n junction portion formed by the second region and the substrate. Therefore, the charge of the capacitor which is connected to the second region may not be decreased. As a result, the difference potential across the capacitor can be maintained at a definite value if only the MIS transistor is nonconductive. This is helpful in writing new data onto the EPROM in a light room.

The present invention will be more clearly understood from the following description with reference to the accompanying drawings.

BRIEF DESCRIPTION OF THE DRAWINGS

FIG. 7 is a plan view illustrating a second embodiment of the semiconductor device of the present invention;

FIG. 11 is a cross-sectional view taken along the lines XI—XI of FIG. 10, and;

FIG. 12 is a cross-sectional view taken along the lines XII—XII of FIG. 10.

DETAILED DESCRIPTION OF THE PREFERRED EMBODIMENTS

Figure 1:
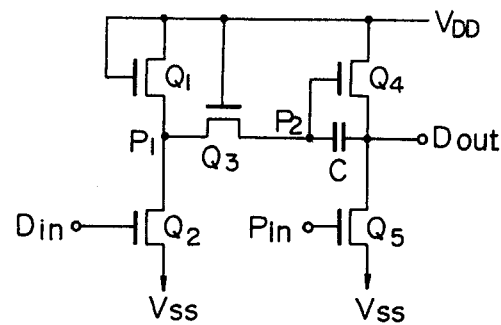
FIG. 1 is a circuit diagram illustrating a general bootstrap circuit formed by MIS field effect transistors.

Referring to FIG. 1, a bootstrap circuit comprises five MIS field effect transistors such as n-channel type MOS (Metal Oxide Semiconductor) transistors $Q_1$ through $Q_5$ and a capacitor C arranged between the gate and the source of the MOS transistor $Q_4$. The drain and the gate of the MOS transistor $Q_1$ are connected to a power supply line $V_{DD}$ whose potential is, for example, 25 volts, while the source of the transistor $Q_1$ is connected to the drains of the MOS transistors $Q_2$ and $Q_3$. The gate of the MOS transistor $Q_2$ is connected to a control signal input terminal $D_{in}$, while the source of the MOS transistor $Q_2$ is connected to another power supply line $V_{SS}$ (earth line) whose potential is, for example, 0 volt. The gate of the MOS transistor $Q_3$ is connected to the power supply line $V_{DD}$, while the source of the MOS transistor $Q_3$ is connected to the gate of the MOS transistor $Q_4$. The source of the MOS transistor $Q_4$ and the drain of the MOS transistor $Q_5$ are connected to an output terminal $D_{out}$, while the gate of the MOS transistor $Q_5$ is connected to a program signal input terminal $P_{in}$. It should be noted that the MOS transistors $Q_1$ and $Q_4$ serve as load transistors, while the MOS transistors $Q_2$ and $Q_5$ serve as input transistors. In addition, the MOS transistor $Q_3$ is used to charge the capacitor C and maintain the charge stored in the capacitor C. The bootstrap circuit of FIG. 1 is operated as follows.

Figure 2:
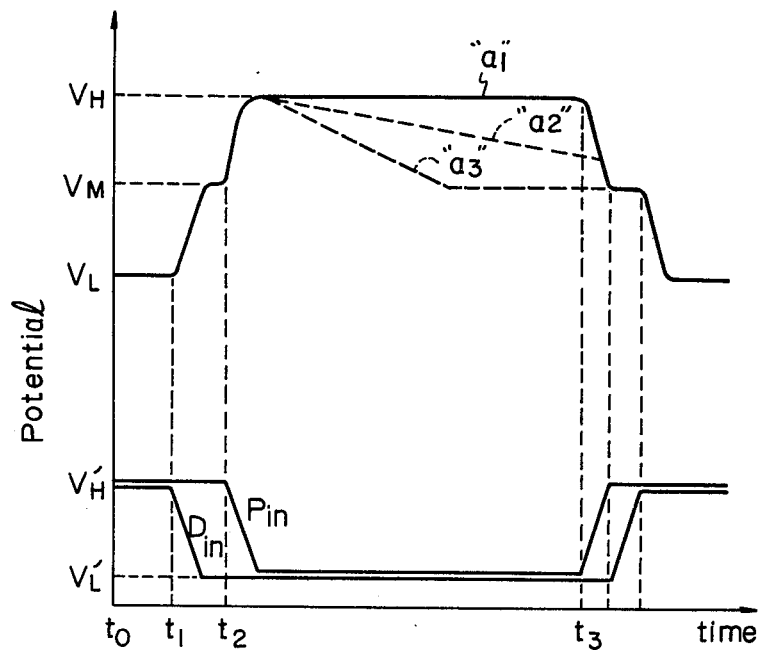
FIG. 2 is a graph for explaining the operation of the bootstrap circuit of FIG. 1.

FIG. 2 is a graph for explaining the operation of the bootstrap circuit of FIG. 1. In FIG. 2, upper curves "a1", "a2" and "a3" illustrate the change of the potential at node $P_2$ of FIG. 1 and the lower curves show the potentials of the terminals $D_{in}$ and $P_{in}$. As illustrated in FIG. 2, at time $t_0$, the potentials at the terminals $D_{in}$ and $P_{in}$ remain at a high voltage $V_H'$ which is higher than a common threshold voltage of all the MOS transistors (hereinafter referred to as $V_{th}$). In this case, since both of the MOS transistors $Q_1$ and $Q_2$ are conductive, the potential at node $P_1$ becomes lower than $V_{th}$, if the resistivity of the MOS transistor $Q_2$ is much lower than that of the MOS transistor $Q_1$. In addition, since the MOS transistor $Q_3$ is conductive, the potential at node $P_2$ is also lower than $V_{th}$ and the MOS transistor $Q_4$ is nonconductive. The value of these potentials is defined as $V_L$ as illustrated in FIG. 2. In addition, since the potential at the input terminal $P_{in}$ is also $V_H'$, the MOS transistor $Q_5$ is conductive. Therefore, the potential at the output terminal $D_{out}$ also becomes $V_{SS}$ (here $V_{SS}$ and $V_{DD}$ are also defined as the voltages of the supply line $V_{SS}$ and $V_{DD}$, respectively).

Next, as illustrated in FIG. 2, at time $t_1$, when the potential at the input terminal $D_{in}$ is changed from the voltage $V_H'$ to a voltage $V_L'$ which is lower than $V_{th}$, the MOS transistor $Q_2$ cuts off. After that, the potential at node $P_1$ becomes high and, accordingly, the potential at node $P_2$ becomes high since the MOS transistor $Q_3$ is conductive. Finally, both of the potentials at nodes $P_1$ and $P_2$ reach a voltage $V_M (= V_{DD} - V_{th})$. On the other hand, the MOS transistors $Q_4$ and $Q_5$ are conductive. Since the resistivity of the MOS transistor $Q_5$ is much smaller than that of the MOS transistor $Q_4$, the potential at the output terminal $D_{out}$ remains low. Therefore, the difference in potential between the capacitor C becomes nearly $V_M$.

Next, as illustrated in FIG. 2, at time $t_2$, when the potential at the input terminal $P_{in}$ is changed from the voltage $V_H'$ to the voltage $V_L'$, the MOS transistor $Q_5$ cuts off. As a result, the potential at the output terminal $D_{out}$ becomes high and, in addition, the potential at node $P_2$ becomes high, since the capacitor C is arranged between the terminal $D_{out}$ and the node $P_2$, and the MOS transistor $Q_3$ is nonconductive. Finally, the potential at the output terminal $D_{out}$ becomes $V_{DD}$ and, at this time, the potential at node $P_2$ becomes $V_H$ (this value is determined by the capacitor C and the capacitance formed between the node $P_2$ and the substrate). Therefore, if the potential at node $P_2$ is maintained at $V_H$ until time $t_3$, as illustrated in FIG. 2 (line "a1"), the potential at the output terminal $D_{out}$ is also maintained at $V_{DD}$ until time $t_3$.

The above-mentioned bootstrap circuit is manufactured in a body with an EPROM which can be erased by ultraviolet light by using semiconductor technology, especially, MOS technology. Since the package of the EPROM has a window for receiving the ultraviolet light, the bootstrap circuit may be also exposed to the light in a light room. Therefore, during reprogramming, light penetrates into a p-n junction portion of the source of the MOS transistor $Q_3$. The charge stored in the source may be decreased and the potential at node $P_2$ may become low, as illustrated in FIG. 2 (dotted lines "a2" or "a3"). Following this, the conductance of the MOS transistor $Q_4$ becomes small, and the potential at the output $D_{out}$ also may become lower than $V_{DD}$. Therefore, by an output signal from the bootstrap circuit, reprogramming cannot be effected. In order to prevent light from penetrating into the p-n junction portion at node $P_2$, the bootstrap circuit manufactured by MOS technology according to the present invention, is provided with a cover, such as a metal layer overlying the node $P_2$, i.e., the source of the MOS transistor $Q_3$.

Figure 3:
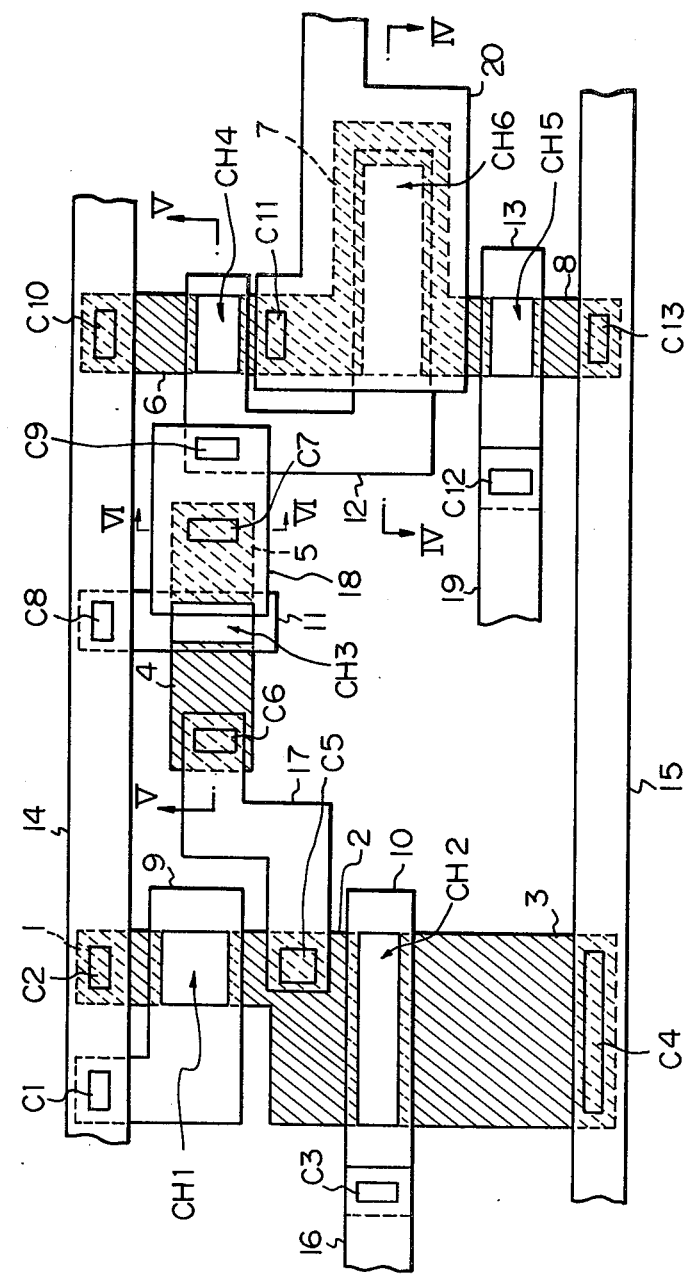
FIG. 3 is a plan view illustrating a first embodiment of the semiconductor device of the present invention.

FIG. 3 is a plan view illustrating a first embodiment of the semiconductor device of the present invention. The substrate such as a p-type silicon (Si) substrate is initially prepared. On the substrate, a thin silicon dioxide ($SiO_2$) layer 21 and a thick silicon dioxide layer 22 (shown not in FIG. 3, but in FIG. 4) are formed. The area where a thin oxide layer is formed is called as "active area", while the area where a thick oxide layer is formed is called "field area". The active area is divided into channel areas CH1, CH2 ..., CH6 and n+ type regions 1 through 8, wherein the areas CH1, CH2, ..., CH5 correspond to the channel region of the MOS transistors $Q_1, Q_2, ..., Q_5$ and the area CH6 corresponds to the capacitor C. The n+ type regions are formed in the substrate after the thin oxide layers thereon are removed. In addition, first electrically conductive layers 9 through 13 made of, for example, polycrystalline silicon overlying the channel areas CH1, CH2, ..., CH6 are deposited. Next, second electrically conductive layers 14 through 20 which are made of, for example, aluminium, are deposited. The layers 14 and 15 correspond to the power supply lines $V_{DD}$ and $V_{SS}$ (FIG. 1), respectively, and the layers 16, 19 and 20 are connected to the control signal input terminal $D_{in}$, the program signal input terminal $P_{in}$ and the output terminal $D_{out}$ (FIG. 1), respectively. Between the two kinds of electrically conductive layers, an insulating layer 23 (shown not in FIG. 3, but in FIG. 4) made of, for example, Phosphosilicate Glass (hereinafter referred as to PSG) or silicon dioxide ($SiO_2$), is provided. In addition, over the second electrically conductive layers, another insulating layer 24 (see FIG. 4) which is, for example, made of PSG is also provided. C1 through C13 are contacts for interconnecting electrically conductive layers, and n+ type regions. It should be noted that the electrically conductive layer 18 overlies the n+ type source region 5. The area of the layer 18 is larger than that of the n+ type source region 5. Therefore, most of the light toward the n+ type source region 5 is reflected at the upper surface of the conductive layer 18 so that the light hardly penetrates into the p-n junction portion formed by the n+ type source region and p-type substrate. As a result, when the MOS transistor $Q_3$ (FIG. 1), whose gate corresponds to the area CH3, is nonconductive, the charge of the n+ type source region 5 may not decrease and the charge of the capacitor C also may not decrease.

Figure 4:
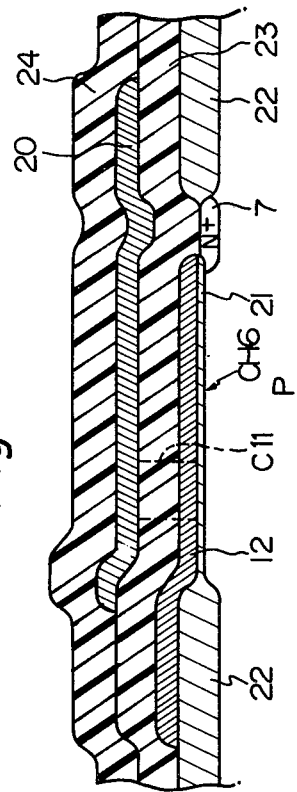
FIG. 4 is a cross-sectional view taken along the lines IV—IV of FIG. 3.

FIG. 4 is a cross-sectional view taken along the lines IV—IV of FIG. 3, showing the structure of the capacitor C. The capacitor C consists of two conducting surfaces separated by the thin oxide layer 21. One of the two surfaces is in contact with the electrically conductive layer 12, while the other is adjacent to the n+ type region 7 which is connected to the electrically conductive layer 20 through the contact C11. Since the thin oxide layer 21 is, for example, a thickness of 500~800 Å, the capacity of the capacitor C is very large, even if the area CH6 is small.

Figure 5:
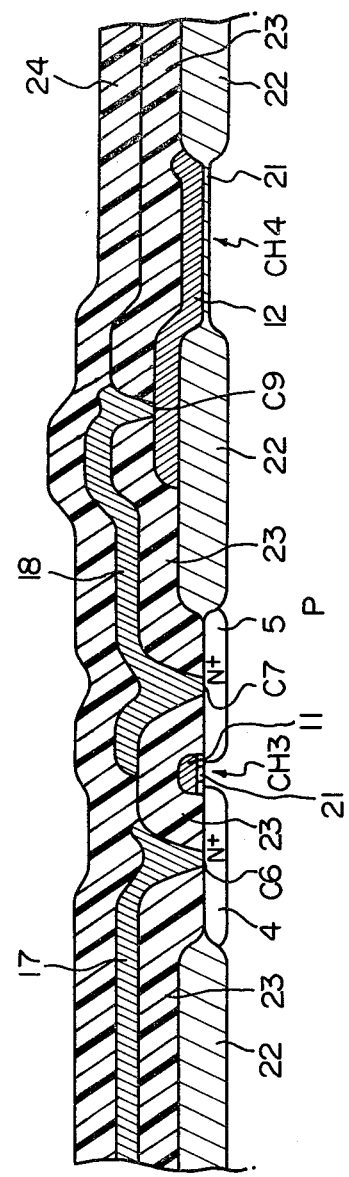
FIG. 5 is a cross-sectional view taken along the line V—V of FIG. 3.

FIG. 5 is a cross-sectional view taken along the lines V—V of FIG. 3, showing the structure of the MOS transistors $Q_3$ and $Q_4$. The MOS transistor $Q_3$ is composed of an electrically conductive layer 11 which is, for example, made of polycrystalline silicon, as a gate electrode, a thin oxide layer 21, and two n+ type regions 4 and 5, as a drain and a source thereof, respectively. The n+ type drain region 4 is connected to an electrically conductive layer 17 at a contact C6, while the n+ type source region 5 is connected to an electrically conductive layer 18 at a contact C7. The conductive layer 18 is connected to an electrically conductive layer 12, which serves as a gate electrode of the MOS transistor $Q_4$ and is also connected to a capacitor C (FIG. 1). As can be understood from FIG. 5, the conductive layer 17 covers the n+ type drain region 4 incompletely, while the conductive layer 18 covers the whole of the n+ type source region 5 with the insulating layer in-between. Therefore, it is hard for light to penetrate into the n+ type source region 5 through the insulating layers 23 and 24.

Figure 6A:
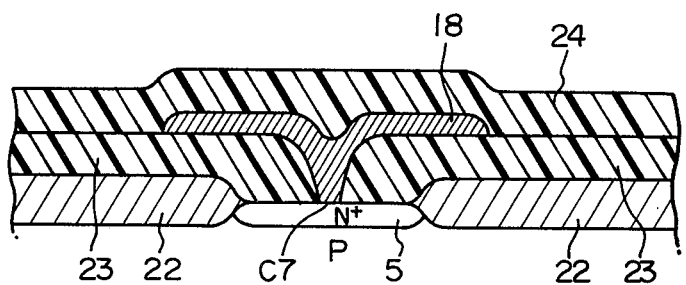
FIG. 6A is a cross-sectional view taken along the lines VI—VI of FIG. 3.

FIG. 6A is a cross-sectional view taken along the lines VI—VI of FIG. 3, showing the structure of the MOS transistor $Q_3$. As can be easily understood, the electrically conductive layer 18 covers the whole of the n+ type source region 5 with the insulating layer in-between.

Figure 6B:
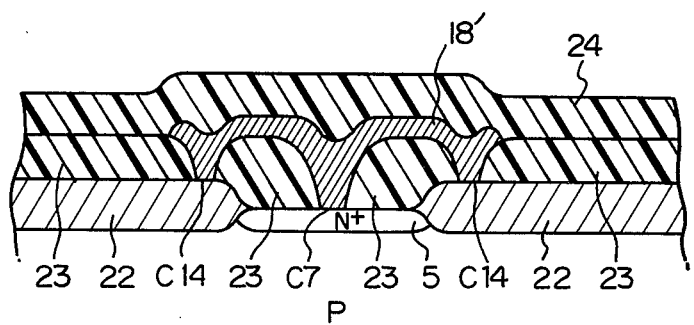
FIG. 6B is a modification of FIG. 6A.

FIG. 6B is a modification of FIG. 6A, showing the structure of the MOS transistor $Q_3$. The electrically conductive layer 18' is a modification of the electrically conductive layer 18. The conductive layer 18' is also connected non-electrically to a thick oxide layer 22 at a contact C14. The contact C14 is placed in the neighbourhood of the n+ type source region 5. Therefore, the penetration of light into the n+ type source region 5 can be blocked by the conductive layer 18' more reliably, than with the conductive layer 18 of FIG. 6A.

In FIG. 6B, it should be noted that, in the manufacturing process of the semiconductor device, both of the contacts C7 and C14 are formed in the insulating layer 23 in one step. However, an aperture can be formed at the same position as the contact C14 and the depth of the aperture can be about half of the thickness of the insulating layer 23. After that, the electrically conductive layer 18' can be formed on the aperture. In this case, the penetration of light into the n+ type source region 5 can be also blocked by the conductive layer 18' more reliably, as compared with the conductive layer 18 of FIG. 6A.

Figure 8:
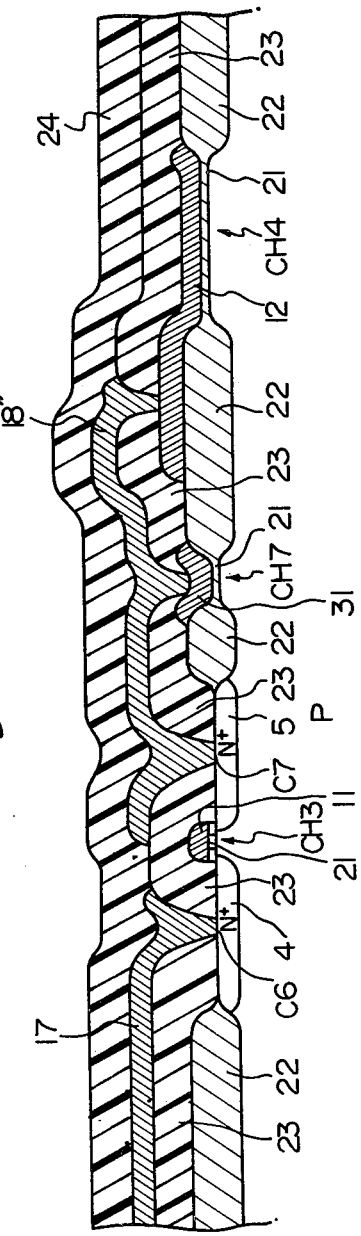
FIG. 8 is a cross-sectional view taken along the lines VIII—VIII of FIG. 7.
Figure 9:
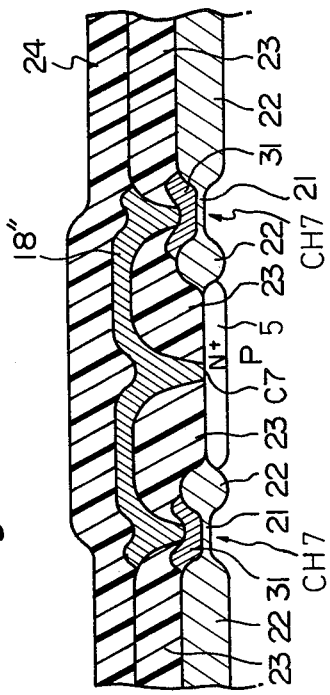
FIG. 9 is a cross-sectional view taken along the lines IX—IX of FIG. 7.

FIG. 7 is a plan view illustrating a second embodiment of the semiconductor device of the present invention. And FIGS. 8 and 9 are cross-sectional views taken along the lines VIII—VIII and the lines IX—IX, respectively. The elements illustrated in FIG. 7 which are identical with those of FIG. 3 are given the same reference numerals as used in FIG. 3. In FIG. 7, a channel area CH7 which is placed in the neighbourhood of the n+ type source region 5 is provided (see also FIGS. 8 and 9). In this case, the channel area CH7 does not form a gate of a MOS transistor, since the area CH7 is surrounded by the thick oxide layer 22. On the channel area CH7, an electrically conductive layer 31 which is, for example, made of polycrystalline silicon, is formed. In addition, an electrically conductive layer 18", which is similar to the electrically conductive layer 18' of FIG. 6B, is formed. Therefore, the penetration of light into the n+ type source region 5 is blocked more reliably, as compared with the conductive layer 18 of FIG. 6A.

Figure 10:
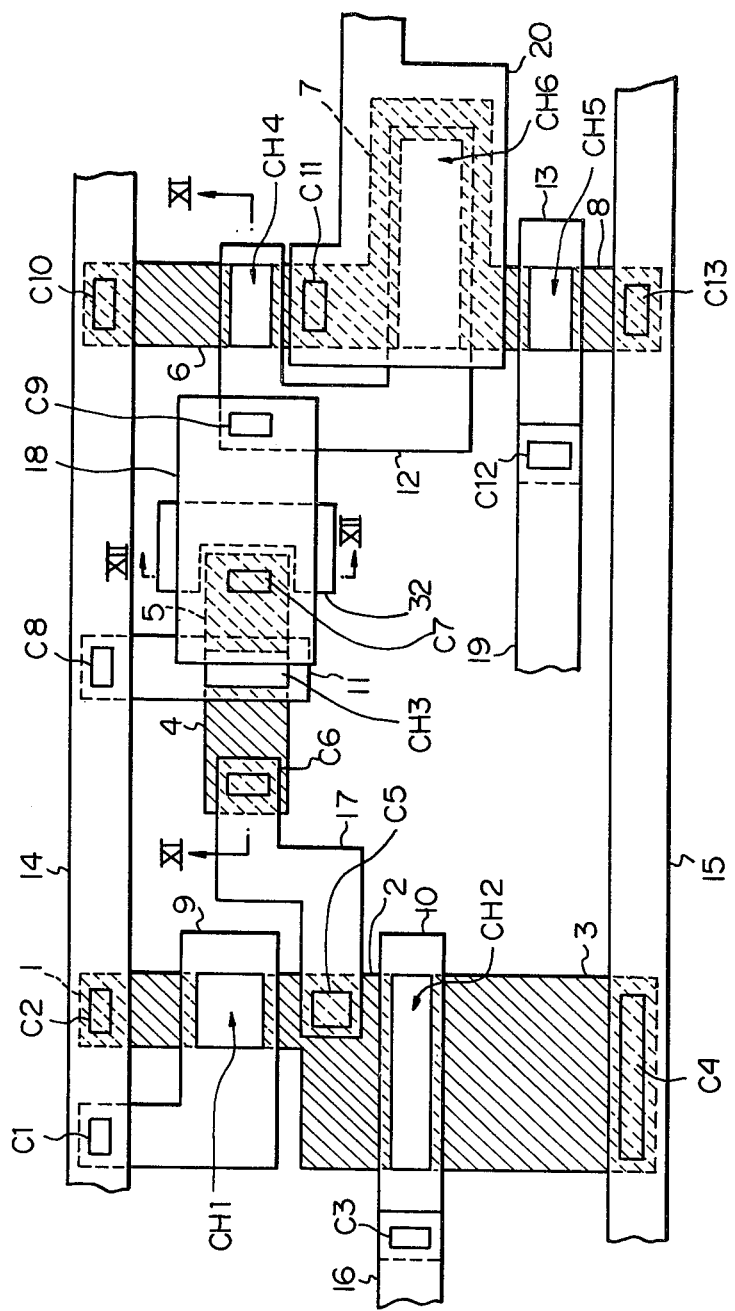
FIG. 10 is a plan view illustrating a third embodiment of the semiconductor device of the present invention.

FIG. 10 is a plan view illustrating a third embodiment of the semiconductor device of the present invention. And FIGS. 11 and 12 are cross-sectional views taken along the lines XI—XI and the lines XII—XII, respectively, of FIG. 10. The elements illustrated in FIG. 10 which are identical with those of FIG. 3 are given the same reference numerals as used in FIG. 3. In FIG. 10, an electrically conductive layer 32 which is, for example, made of polycrystalline silicon is provided on the thick oxide layer 22 (see also FIGS. 11 and 12) and is placed in the neighbourhood of the n+ type source region 5. In general, the reflection factor of polycrystalline silicon material is greater than that of silicon dioxide material. Therefore, most of the light from outside which comes into the insulating layer 23 in the neighbourbood of the conductive layer 18 is reflected at the upper surface of the conductive layer 18, while the remainder is reflected at the surfaces of the conductive layer 32 and at the surface of the substrate and said remainder is attenuated. Therefore, the penetration of light into the n+ type source region 5 is blocked more reliably, as compared with the conductive layer 18 of FIG. 6A.

Actually, a bootstrap circuit device including a structure illustrated in FIGS. 7, 8 and 9 is manufactured with the following parameters.

| | |
|---|---|
| Concentration of p-type substrate | $\sim 10^{15}/cm^3$ |
| Concentration of n$^+$-type region 5 | $\sim 10^{22}/cm^3$ |
| Depth of n$^+$-type region 5 | $0.8 \sim 1.0\ \mu m$ |
| Area of n$^+$-type region 5 | $\sim 1.0\ \mu m\square$ |
| Thickness of thick insulating layer 22 (SiO$_2$) | $\sim 8,000$ A |
| Thickness of thin insulating layer 21 (SiO$_2$) | $800 \sim 1,000$ A |
| Thickness of electrically conductive layer 31 (Polycrystalline silicon) | $\sim 4,000$ A |
| Thickness of electrically conductive layer 18″ (Al) | $1 \sim 1.5\ \mu m$ |
| Distance between n$^+$-type region 5 and channel area CH7 | $\sim 10\ \mu m$ |

In the above-mentioned bootstrap circuit device, the time which it takes for the potential (see FIG. 2) to change from $V_H$ to $V_M$ is about 100 ms (in the prior art device, the time is on the order of $10^2\ \mu s$). This is helpful for improving the characteristics of the device, since the frequency of writing pulses for an EPROM is, for example, about 50 ms.

As has been mentioned above, the semiconductor device may be manufactured by using n-type MOS technology. However, it should be noted that the semiconductor device can be also manufactured by using p-type MOS technology. In this case, the semiconductor device comprises an n-type substrate and p$^+$ type regions formed in the substrate, whereby p-channel type MOS transistors are formed.

In addition, in the above-mentioned embodiments, gate electrodes of the MOS transistors are made of polycrystalline silicon. However, it should be noted that the gate electrodes can be also made of metals such as molybdenum (Mo) or tungsten (W).

Furthermore, in order to ensure more reliable isolation between the MOS transistors and between the MOS transistor and the capacitor, high density regions of the same conductivity type as that of the substrate, which are called "channel cut regions" or "channel stoppers", can also be formed between the thick insulating layer and the substrate. In this case, the high density regions are manufactured by ion-implantation technology or diffusion technology.

As explained hereinbefore, the semiconductor device for use in bootstrap circuits included in an EPROM which can be erased by ultraviolet light according to the present invention has an advantage in that the EPROM can be reprogrammed effectively even in a light room, because the light penetrating into the node at the capacitor is blocked and the charge of the capacitor is not decreased in the light room.

What is claimed is:

1. A semiconductor device for use in bootstrap circuits, comprising:
   a semiconductor substrate, having a surface, of a first conductivity type;
   first, second and third regions of a second conductivity type formed in said semiconductor substrate;
   a first insulating layer having a first portion with a surface formed on the surface of said semiconductor substrate between said first and second regions, said first insulating layer further having a second portion with a surface formed on the surface of said semiconductor substrate adjacent to said third region;
   a first electrically conductive layer formed on the surface of said first portion of said first insulating layer, said first electrically conductive layer, said first portion of said first insulating layer and said first and second regions forming an MIS transistor;
   a second electrically conductive layer, having a surface, formed on the surface of said second portion of said first insulating layer, wherein a capacitor is formed by said surface of said second electrically conductive layer and by the surface of said substrate adjacent to said third region, said surface of said second electrically conductive layer and said surface of said substrate separated by said second portion of said first insulating layer, said second electrically conductive layer electrically connected to said second region; and
   a substantially radiation opaque layer, having a first contact formed on said second region and having a second contact formed on said second electrically conductive layer, for preventing radiation from penetrating into said second region, said substantially radiation opaque layer overlying the whole of said second region.

2. A semiconductor device for use in bootstrap circuits comprising:
   a semiconductor substrate, having a surface, of a first conductivity type;
   first, second and third regions of a second conductivity type formed in said semiconductor substrate;
   a first insulating layer having a first portion with a surface formed on the surface of said substrate between said first and second regions, said first insulating layer further having a second portion with a surface formed on the surface of said substrate adjacent to said third region;
   a second insulating layer formed on the surface of said substrate between said second region and said second portion of said first insulating layer;
   a first electrically conductive layer formed on the surface of said first portion of said first insulating layer, said first electrically conductive layer, said first portion of said first insulating layer and said first and second regions forming an MIS transistor;
   a second electrically conductive layer, having a surface, formed on the surface of said second portion of said first insulating layer and extending to said second insulating layer, wherein a capacitor is formed by said surface of said second electrically conductive layer and said surface of said semiconductor substrate adjacent to said third region, said surface of said second electrically conductive layer and said surface of said semiconductor substrate separated by said second portion of said first insulating layer;
   a third electrically conductive layer for connecting said second region and said second electrically conductive layer, said third electrically conductive layer overlying the whole of said second region; and
   a third insulating layer formed between said first and second electrically conductive layers, and said third electrically conductive layer.

3. A device as set forth in claim 2, wherein said third electrically conductive layer is connected to said second insulating layer at a contact, said contact formed adjacent to said second region.

4. A device as set forth in claim 2, wherein said first insulating layer has a third portion adjacent to said second region, said device further comprising a fourth electrically conductive layer formed on said third portion of said first insulating layer, said third electrically conductive layer connected to said fourth electrically conductive layer.

5. A device as set forth in claim 2, further comprising a fifth electrically conductive layer formed on said second insulating layer adjacent to said second region.

6. A device as set forth in claim 1 or 2, wherein said semiconductor substrate is silicon.

7. A device as set forth in claim 2, 3, 4 or 5 wherein said first, second and third insulating layers are silicon dioxide.

8. A device as set forth in claim 2, 3, 4 or 5 wherein said first insulating layer is a silicon dioxide layer having a thickness of from 800 to 1,000 angstrom units.

9. A device as set forth in claim 2, 3, 4 or 5 wherein said second insulating layer is a silicon dioxide layer having a thickness greater than 1,000 angstrom units.

10. A device as set forth in claim 1 or 2, wherein said first and second electrically conductive layers are polycrystalline silicon layers.

11. A device as set forth in claim 1 or 2, wherein said first and second electrically conductive layers are molybdenum layers.

12. A device as set forth in claim 1 or 2, wherein said first and second electrically conductive layers are tungsten layers.

13. A device as set forth in claim 2, wherein said third electrically conductive layer is an aluminum layer.

14. A semiconductor device, for use in an erasable and programmable read-only memory device, comprising:

means for providing first and second input signals;

a power supply line;

a ground line;

a first MIS field effect transistor, having a gate and a source operatively connected to said power supply line, and having a drain;

a second MIS field effect transistor, having a source operatively connected to the drain of said first MIS field effect transistor at a first node, having a gate operatively connected to receive said first input signal, and having a drain operatively connected to said ground line;

a third MIS field effect transistor, having a gate operatively connected to said power supply line, having a drain operatively connected at said first node, and having a source;

a fourth MIS field effect transistor, having a source operatively connected to said power supply line, having a gate operatively connected to the source of said third MIS field effect transistor at a second node, and having a drain;

a fifth MIS field effect transistor, having a source operatively connected to the drain of said fourth MIS field effect transistor at a third node, having a gate operatively connected to receive said second input signal, and having a drain operatively connected to the ground line;

a capacitor operatively connected between said second and third nodes; and cover means for protecting the source p-n junction of said third MIS field effect transistor by preventing radiation from penetrating thereinto when the erasable and programmable read-only memory device is irradiated.

15. A device as set forth in claim 14, wherein said MIS field effect transistors are MOS field effect transistors.

* * * * *

UNITED STATES PATENT AND TRADEMARK OFFICE
CERTIFICATE OF CORRECTION

PATENT NO. : 4,291,326
DATED : September 22, 1981
INVENTOR(S) : MITSUO HIGUCHI ET AL It is certified that error appears in the above—identified patent and that said Letters Patent is hereby corrected as shown below:

Front page, [73] Assignee, after ""Limited," insert the city --Kawasaki,--;
[56] References Cited, after "Heller" insert --et al.--;
after "Redwine" insert --et al.--;
after "Clemens" insert --et al.--.

Column 1, line 49, "grain" should be --drain--;
line 51, delete ",".
Column 2, line 31, "aluminium" should be --aluminum--;
line 51, "onto" should be --into--;
line 68, "line" should be --lines--.
Column 4, line 59, "as" should be --an--.
Column 5, line 5, "aluminium" should be --aluminum--.
Column 6, line 12, delete ",".
Column 7, lines 9, 11 & 13, "A" should be --Å--.

Signed and Sealed this

Twenty-third Day of February 1982

[SEAL]

Attest:

GERALD J. MOSSINGHOFF

Attesting Officer    Commissioner of Patents and Trademarks